United States Patent
Arena et al.

(10) Patent No.: US 8,741,385 B2
(45) Date of Patent: Jun. 3, 2014

(54) THERMALIZATION OF GASEOUS PRECURSORS IN CVD REACTORS

(71) Applicant: Soitec, Bernin (FR)

(72) Inventors: Chantal Arena, Mesa, AZ (US); Christiaan J. Werkhoven, Gilbert, AZ (US); Ronald Thomas Bertram, Jr., Mesa, AZ (US); Ed Lindow, Cornville, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/751,558

(22) Filed: Jan. 28, 2013

(65) Prior Publication Data

US 2013/0137247 A1    May 30, 2013

Related U.S. Application Data

(62) Division of application No. 12/261,796, filed on Oct. 30, 2008, now Pat. No. 8,388,755.

(60) Provisional application No. 61/031,837, filed on Feb. 27, 2008.

(51) Int. Cl.
  *C23C 16/30* (2006.01)

(52) U.S. Cl.
  USPC .......... 427/255.28; 427/255.39; 427/255.394; 118/715

(58) Field of Classification Search
  USPC .......... 427/255.28, 255.39, 255.394; 118/715
  See application file for complete search history.

(56) References Cited

U.S. PATENT DOCUMENTS

| | | | |
|---|---|---|---|
| 3,690,638 A | 9/1972 | Roblin et al. | 118/726 |
| 4,081,313 A | 3/1978 | McNeilly et al. | 117/103 |
| 4,911,102 A | 3/1990 | Manabe et al. | 118/719 |
| 5,001,327 A | 3/1991 | Hirasawa et al. | 219/390 |
| 5,053,247 A | 10/1991 | Moore | 427/586 |
| 5,167,716 A | 12/1992 | Boitnott et al. | 118/719 |
| 5,207,835 A | 5/1993 | Moore | 118/725 |
| 5,233,163 A | 8/1993 | Mieno et al. | 219/390 |
| 5,340,401 A | 8/1994 | Cann | 118/725 |

(Continued)

FOREIGN PATENT DOCUMENTS

EP   1 065 913 A2   1/2001
JP   5-283339 A   10/1993

(Continued)

OTHER PUBLICATIONS

International Search Report and Written Opinion of the International Searching Authority, application No. PCT/US2008/081767, May 26, 2010.

(Continued)

*Primary Examiner* — Elizabeth Burkhart
(74) *Attorney, Agent, or Firm* — Winston & Strawn LLP

(57) ABSTRACT

The present invention relates to the field of semiconductor processing and provides methods that improve chemical vapor deposition (CVD) of semiconductor materials by promoting more efficient thermalization of precursor gases prior to their reaction. In preferred embodiments, the method provides heat transfer structures and their arrangement within a CVD reactor so as to promote heat transfer to flowing process gases. In certain preferred embodiments applicable to CVD reactors transparent to radiation from heat lamps, the invention provides radiation-absorbent surfaces placed to intercept radiation from the heat lamps and to transfer it to flowing process gases.

18 Claims, 4 Drawing Sheets

(56) References Cited

U.S. PATENT DOCUMENTS

| | | | | |
|---|---|---|---|---|
| 5,683,518 | A | 11/1997 | Moore et al. | 118/730 |
| 5,763,856 | A | 6/1998 | Ohkase | 219/390 |
| 5,891,251 | A | 4/1999 | MacLeish et al. | 118/719 |
| 6,015,465 | A | 1/2000 | Kholodenko et al. | 118/719 |
| 6,108,190 | A | 8/2000 | Nagasaki | 361/234 |
| 6,140,624 | A | 10/2000 | Gilbert, Sr. | 219/553 |
| 6,325,858 | B1 * | 12/2001 | Wengert et al. | 118/725 |
| 6,506,254 | B1 | 1/2003 | Bosch et al. | 118/715 |
| 6,632,725 | B2 * | 10/2003 | Trassoudaine et al. | 438/479 |
| 2005/0142391 | A1 * | 6/2005 | Dmitriev et al. | 428/698 |
| 2007/0014990 | A1 | 1/2007 | Arico et al. | 428/408 |
| 2009/0214785 | A1 | 8/2009 | Arena et al. | 427/255.28 |
| 2011/0277681 | A1 | 11/2011 | Arena et al. | 117/88 |

FOREIGN PATENT DOCUMENTS

| | | |
|---|---|---|
| JP | 2004-524699 A | 8/2004 |
| WO | WO 97/08356 A2 | 3/1997 |
| WO | 02/078070 A1 | 10/2002 |
| WO | WO 2007/011581 A1 | 1/2007 |

OTHER PUBLICATIONS

Cumberland et al., "Thermal Control of Metathesis Reactions Producing GaN and InN," J. Phys. Chem. B, 105:11922-11927 (2001).
Dauelsberg et al., "Modeling and process design of III-nitride MOVPE at near-atmospheric pressure in close coupled showerhead and planetary reactors," Journal of Crystal Growth, 298:418-424 (2007).
Fotiadis et al., "Flow and Heat Transfer in CVD Reactors: Comparisons of Raman Temperature Measurements and Finite Element Model Predictions," Journal of Crystal Growth, 100:577-599 (1990).
Martin et al., "Modelling of group-III nitride MOVPE in the closed coupled showerhead reactor and Planetary Reactor," Journal of Crystal Growth, 303:318-322 (2007).
Sun et al., "Comparative Study of GaN Growth Processes by MOVPE," Mat. Res. Soc. Symp. Proc., 572:463-468 (1999).

* cited by examiner

THERMALIZATION OF GASEOUS PRECURSORS IN CVD REACTORS

FIELD OF THE INVENTION

The present invention relates to the field of semiconductor processing and provides apparatus and methods that improve chemical vapor deposition (CVD) of semiconductor materials by promoting more efficient thermalization of precursor gases prior to their reaction.

BACKGROUND OF THE INVENTION

The temperature of gaseous precursors prior to their reaction in a chemical vapor deposition (CVD) reactor is an important parameter for achieving efficient deposition at the desired location, e.g., for efficiently depositing the intended semiconductor material on the intended substrate.

Consider, for example, growth of GaN by halide (hydride) vapor phase epitaxy (HVPE) processes. Certain HVPE processes react gaseous $GaCl_3$ directly with gaseous $NH_3$ in a CVD reactor chamber to yield GaN, which deposits on a substrate, and $NH_4Cl$, which exhausts from the reactor. However, this direct reaction proceeds efficiently only if the precursor gases are at temperatures of about 900-930° C. and above, because at lower temperatures (it is believed) the precursor gases have not adequately decomposed into directly reactive species and thus cannot rapidly react. Also, at lower temperatures, $GaCl_3$ and $NH_3$ can form unreactive and undesired, adducts, e.g., $GaCl_3:NH_3$. Accordingly, significant fractions of inadequately thermalized precursor gases can be simply wasted; they pass through the reactor and out the exhaust either unreacted or as unreactive adducts. Similar effects arise in the CVD growth of other III-N compound semiconductors by HVPE and other processes, and also more generally, in the growth of III-V compound semiconductors.

Further, waste of inadequately thermalized precursors can be greater in high volume manufacturing (HVM) of III-V compounds, and the wasted fraction can increase as higher growth rates are sought. This is possibly because: higher growth rates require higher precursor flow rates; higher flow rates decrease times available for reaction in the vicinity of the intended substrate; and decreased reaction times reduce the efficiency of reaction-rate-limited growth processes.

However, problems have hindered achieving adequate thermalization of precursor gases, especially in the case of HVM of III-V compounds where corrosive precursor gases must be thermalized to high temperatures. First, it has not been possible to adequately thermalize precursor gases prior to entering the reactor chamber. Typical precursor gases at high temperatures can rapidly corrode materials commonly used in known gaseous delivery systems, and such corrosion can further lead to particle formation/deposition in delivery lines, reduced reactor cleanliness, eventual line blockage, and so forth. But use of corrosion-resistant materials, e.g., quartz, graphite, silicon carbide, etc, in gaseous delivery systems would be prohibitively expensive.

Further, it has also not been possible to achieve adequate precursor-gas thermalization within known CVD reactors after their entry into the reactor chamber. Especially in the case of HVM of GaN (and other III-V compounds), precursor gas flows can be unusually high, e.g., in excess of 50 slm (standard liters min.). At such high flow rates, precursor gases move too quickly through the high temperature zone in the reactor to become adequately thermalized prior to traversing the growth substrate.

Uses of planar radiation-absorbing materials in the interior of CVD reactor chambers have been described in, e.g., U.S. Pat. No. 6,325,858. This patent discloses use of a silicon carbide (SiC) plates placed downstream of the susceptor as "getter" plates on which unwanted deposition preferentially occurs. This patent also discloses use of SiC plates in contact with the quartz chamber walls in order to heat the walls and thereby also limit unwanted deposition. Dauelsberg et al. (Journal of Crystal Growth 298 418 (2007)) describe a perforated cover plate for a standard showerhead gas injector of the type used in MOCVD (metal organic CVD) processes for growing GaN which is stated to increase temperatures.

Thus, although proper thermalization of the precursor gases used in the HVM of III-V compounds, and especially of GaN, is important, the prior art provides no adequate teachings (of which the inventors are aware) concerning how such thermalization can be accomplished.

SUMMARY OF THE INVENTION

Generally, the present invention comprises improvements to heated chemical vapor deposition (CVD) reactors, particularly CVD reactors for production of semiconductor materials. The improvements are structured and arranged within a reactor chamber, in addition to conventional components commonly present in such reactor chambers, specifically to increase heat transfer to flowing precursor gases prior to and during their reaction at a substrate within the reactor. In the absence of heat transfer structures of this invention, heat can be transferred to the flowing gases through the chamber walls, and since CVD chamber walls are generally more peripherally arranged with respect to the flowing gases than are the heat transfer structures of this invention, such heat transfer is less efficient than the improved heat transfer of this invention.

Increased heat transfer promotes improved precursor gas thermalization prior to and at the time of reaction, thereby increasing the efficiency of intended reactions between the precursor gases while limiting unwanted reactions that can lead to unreactive complexes or species. If such complexes or species do form, improved thermalization can promote their decomposition back into precursor forms. Consequently, this invention provides more rapid growth of semiconductor material, improves the efficiency of precursor usage, and limits incorporation of unwanted complexes or species into the growing epilayer. Secondary advantages can include reduction or limitation of unwanted deposition of the semiconductor material, e.g., on reactor chamber wall, or of unwanted condensation of reaction precursors or reaction by-products.

The heat transfer structures of this invention usually transfer and distribute heat from active heating elements already present for heating the reactor chamber to precursor or other process gases flowing within the chamber. Optionally, active heating elements can be provided, in addition to the existing chamber heating elements, that are configured to primarily heat the heat transfer structures. Heat transfer structures of the invention are preferably arranged and configured in view of the characteristics and capabilities of available heating elements and reactor geometries. For example, in the case of resistive heating elements, the heat transfer structures of this invention can act to conduct heat from higher temperature regions into the process gas flows. For example, such heat transfer structures can by configured to provide shorter, more direct heat-conductive paths from higher-temperature regions adjacent to the resistive heating elements into the flowing gases where they can be structured with increased surface area (e.g., plates, fins, baffles, and the like) for improved heat transfer to the flowing gases. Alternatively, specific resistive elements can be provided to heat such heat transfer structures. These structures are preferably made of materials that are both heat-conductive and resistant to conditions inside an operating CVD reactor.

This invention is particularly applicable to reactors heated primarily by radiant heating elements emitting, e.g., RF, microwaves, IR, light, UV, and other types of radiation used for heating in semiconductor processing. Such reactors usually have walls that are (at least in part) substantially transparent to the emitted radiation and accordingly are not directly heated to a significant degree by the emitted radiation. However, their internal components usually are (at least in part) substantially absorbent and accordingly are directly heated by the emitted radiation. Such reactors are known by the name of "cold wall" reactors.

In applications to cold wall reactors, the heat transfer structures of this invention are preferably also substantially absorbent so that they are heated by the radiation emitted by the radiant heating element and in turn heat the flowing gases. Importantly, these structures are configured and arranged within the reactor chamber with respect to the flowing gases so that these gases are efficiently thermalized at least in part prior to reaching the substrate (or other reaction location). The heat so transferred is in addition to any heat that might be transferred to the flowing gases from conventional components already present in reactor chamber. For example, such heat transfer structures can comprise surfaces, one side of which is in the path of radiation emitted by the heating elements, the other side of which is near or in the flowing gases. Such surfaces are also preferably thin (within limits of structural stability) for increased conduction between the surfaces. At least a portion of such heat transfer surfaces are arranged upstream of the susceptor (as defined by the flowing gases) so the precursor gases are thermalized at the time of their reaction.

For compactness but without limitation, the invention is described in the following primarily as applied to a preferred, but common, type of such a cold wall reactor, in particular, a cold wall reactor chamber that provides for largely horizontal flows of process gases from inlet ports, then across a susceptor (or other substrate support) that is generally centrally located within the chamber and then to an exhaust port (or ports). Such reactor chambers can have rotational symmetry, e.g., a flattened spherical structure, but are usually elongated in a horizontal direction with gas primarily flowing along the elongated direction. Such horizontal flow, e.g., along the long axis of a chamber, is referred to herein as "longitudinal" flow. An elongated reactor chamber can have various transverse cross-sections, e.g., circular, oval, square, rectangular, and so forth, with rectangular being common and therefore used in the following description. Chamber walls are largely transparent being usually largely quartz. Chambers are usually heated by radiant heating elements, e.g., heating lamps, that emit radiation to which quartz is substantially transparent. Generally, at least two arrays of heating elements (heating lamps) are provided on opposite sides of the chamber, e.g., an upper array above the reactor chamber and a lower array below the reactor chamber, so that components internal to the reactor, including heat transfer structures of this invention, can be heated on two sides. The conventional components internal to such chambers, e.g., susceptor, its support ring ("Saturn ring"), and so forth, are often made of graphite, SiC coated graphite and/or SiC. They are absorbent and, therefore, directly heated by the heating lamps and capable of transferring some heat to flowing process gases in addition to the heat efficiently transferred by the heat transfer structures of this invention.

In preferred embodiments, heat transfer structures of this invention are arranged within a cold wall reactor so as to define an inner zone, through which the major portion of process gases pass as they flow from inlet ports to substrate. An outer zone is then defined as that part of the reactor chamber that is exterior to the inner zone. The outer zone is usually bounded at least in part by the chamber walls. Portion of an inner zone can also be defined by the heat transfer structures of this invention in cooperation with other internal (conventional) components already present in the reactor. The inner zone, and correspondingly the outer zone, extend longitudinally along the process gas flow, and in various embodiments, can extend along part or all of the gas flow path from inlet ports to substrate (and beyond). Since the heat transfer structures defining the inner zone are heated, as process gases flow through the inner zone from inlet ports to substrate, they become increasingly thermalized. If the inner zone is partially defined in cooperation with other already-present internal components, and if these internal components are also heated, then gases flowing within the inner zone can also receive heat from these components.

Importantly, at least a portion of the inner zone (and therefore also a portion of the outer zone) extend a distance upstream (that is, in a direction against the flow of process gases) of the substrate or susceptor so that, when gases flowing in the inner zone reach the substrate or susceptor, process gases at the susceptor are thermalized. In further embodiments, a portion of the inner zone can extend downstream of the substrate or susceptor.

The inner zone can be considered to form an extended hotter zone located centrally within a reactor chamber, as it is longitudinally arranged along the process gas flow and is defined in part or in full by heated, heat transfer structures (and, optionally, also by heated conventional, internal components). The outer zone can then be considered to form an extended cooler zone located peripherally within a reactor chamber, as it is outside the extended inner zone and is generally bounded at least in part by unheated reactor chamber walls. Thus, this preferred embodiment acts to functionally establish a two-zone reactor heating arrangement, the two zones occupying different portions of the chamber cross section while extending in a uniform manner longitudinally along the chamber. It should be recalled that convention two (or more) zone heating arrangements define zones that occupy different longitudinal positions along the chamber but are uniform across the chamber cross section. In further embodiment, the temperatures of the inner zone relative to the outer zone can be varied longitudinally along the reactor chamber, e.g., by varying the intensity of the heating elements.

Embodiments with inner and outer zones at different temperatures can be considered as a "hybrid cold wall reactor", where the chamber has cooler outer walls with an interior, elongated zone with walls heated at least in part. Also, the inner zone of these embodiments can be considered as an inner, extended "isothermal hot zone" (IHZ). This term is not intended to be literally or restrictively understood. Although the inner zone is hotter and process gases flowing through the inner zone become thermalized, the inner zone generally can be expected to have internal temperature gradients (e.g., is not strictly isothermal). For example, different portions of the defining structures can be heated to different temperatures, and the temperatures of gases flowing through the inner zone increase during thermalization.

In exemplary preferred embodiments in quartz, cold wall reactors, an outer (or upper) boundary of the outer zone can be the cooler quartz reactor wall, while and an inner (or lower) boundary can also serve as an upper boundary of the inner zone. This shared boundary can include one or more of the heat transfer structures of this invention that are heated by radiation emitted from radiant heating elements and passing through the quartz chamber wall. Preferably the inner zone has an additional (or lower boundary) which can be formed at least in part by internal components already present within the reactor chamber. Since these components are often radiation absorbent, the lower boundary of the inner zone can also be heated. Other portions of the lower boundary of the inner zone can be formed by additional radiation-absorbent heat transfer structures. Heat transfer structures can also be provided at additional boundaries of the inner zone, e.g., at lateral boundaries.

In further preferred embodiments, one or more of the heat transfer structures can be plate-like: relatively extended along two dimensions while transversely relatively thin. These plates can be various forms including planar, arched, domed, generally curvilinear, or other shape, and preferably comprise a radiation-absorbent ceramic. Such plates are preferably placed so that they are exposed both to energy from the heating lamps and to flowing process gases. They are further placed so that they are exposed (at least in part) to the flowing process gases prior to these gases reaching the target substrate so that the gases can be better thermalized by the time of their reaction at the substrate. Such plate-like embodiments are referred to herein as black body plates (BBP). The term "black body" (BB) is used herein to refer to practical materials that absorb at least more than 50%, or at least 75%, or more, of incident radiation, and therefore appear black. "BB" is therefore not limited to ideal black bodies.

In further preferred embodiments, the inner zone can have two, three, or four sides which can be planar or curvilinear. A single boundary is not preferred. In further embodiments, two or more boundaries of the inner zone can be heated, e.g., by exposure to radiation from heating lamps. It is not preferred for only a single boundary of the inner zone to be heated. In CVD systems provided with automatic or robotic means for substrate transfer in and out of a reactor chamber, the inner zone is preferably sized and configured so that the automatic or robotic means can transfer substrates without interference.

In further preferred embodiments, the heat transfer structures can be modularly constructed so that different numbers of heat transfer structures, e.g., heat transfer plates, of differing sizes and configurations can be used from time-to-time in a single reactor in order to accommodate the needs of different CVD processes. For example, heat transfer structures can be provided at different locations to heat a local area, or can be arranged to distribute heat also to the quartz reactor wall to prevent, e.g., deposition or condensation. Also, heat transfer structures can be combined with non-absorbent materials (e.g., IR transparent quartz) in various shapes and arranged in locations where heating is not desirable. Thereby, heat can be distributed to selected locations in the inner zone and not to other locations in the inner zone whilst the boundary of the inner zone can remain continuous to avoid introduction of unwanted gas turbulence.

In further preferred embodiments, the inner zone can have different cross sections, e.g., generally rectilinear such as more square or more flattened or the like, or generally curvilinear such as arch-like, semicircular, oblate or the like. In further embodiments, reactor heating elements can also include resistive heating elements, inductive heating elements, and so forth, and separate heating elements can be individually controlled. In further embodiments, the boundaries of the inner zone are preferably structured to introduce minimal turbulence into this gas flow, e.g., by being substantially smooth and largely free of irregularities. In further embodiments, the boundaries of the inner zone are preferably structured to introduce turbulence into this gas flow, e.g., by being largely irregular to provide heating and gases mixing prior to the substrate. In further embodiments, reactor inlet ports and the heat transfer structures are mutually arranged and configured so that a significant fraction of the process gases introduced into the reactor through the inlet ports passes into, and flows through, the inner zone. Thus process gases flowing through the inner zone can be controllably thermalized when they reach the susceptor.

More specifically, a preferred embodiment of the present invention provides a thermalization apparatus suitable for use within a heated CVD reactor chamber. The provided apparatus includes one or more heat transfer structures arranged to receive heat from one or more chamber heat sources and to deliver the received heat to one or more process gases flowing within the chamber, the thermalization apparatus being configured and arranged within the CVD reactor so that at least part of the heat is delivered to the process gases prior to their reaction at a substrate within the chamber. The thermalization apparatus can include also two or more heat transfer structures. Also, the CVD reactor typically contains, arranged within, components additional to the thermalization apparatus, such as a susceptor, or a susceptor support ring, or both.

In further preferred embodiments, at least one of the heat transfer structures can be configured to have a heated surface exposed to the flowing process gases prior to their CVD reaction, such as by being positioned, with respect to process gas flow through the reactor chamber, upstream of the substrate along the process gas flow and spaced apart from the substrate transverse to process gas flow. Further, a surface exposed to the flowing process gases can be heated by conduction from resistive heat sources or by absorption from radiant heat sources. Preferably, at least one of the heat transfer structures includes a material that is both radiation absorbent and also resistant to the thermal and chemical conditions arising within a CVD reactor chamber during selected CVD processes, including during HVPE deposition of a III-V compound. Examples of such materials include graphite, pyrolytic graphite, silicon carbide (SiC), aluminum nitride (AlN), boron nitride (BN), pyrolytic boron nitride (PBN), tantalum carbide (TaC) and boron carbide ($B_4C$).

Another preferred embodiment of the present invention provides a thermalization apparatus suitable for use within a heated CVD reactor chamber having within a susceptor or a susceptor support ring or both. The provided apparatus includes one or more heat transfer structures arranged within the chamber to receive heat from one or more chamber heat sources and to deliver the received heat to one or more process gases flowing within the chamber. This arrangement is such that at least a portion of a heat transfer structure is positioned, with respect to process gas flow through the reactor chamber, to deliver heat to the process gas flow at locations both upstream of the substrate along the process gas flow and spaced apart from the substrate transverse to process gas flow.

In further preferred embodiments, the heat transfer structures can be variously arranged. At least one heat transfer structure can be positioned, with respect to process gas flow through the reactor chamber, to deliver heat to the process gas flow at locations downstream of the substrate along the process gas flow. Two or more heat transfer structures can be arranged, with respect to process gas flow through the reactor chamber, to deliver heat to the process gas flow at locations that at least partially overlap along the process gas flow but are spaced apart and/or angled from each other in directions transverse to process gas flows so as to at least partially define heated walls of an inner zone within the reactor chamber through which the process gas flow. At least one heat transfer structure includes a heated surface that can be positioned between process gas inlets and the substrate. A plurality of heated surfaces can be arranged one after the other along the process gas flow through the chamber. Further, at least one additional component (other than a heat transfer structure) can be arranged within the chamber to be heated and to cooperate with at least one heat transfer structure so as to at least partially define heated walls of an inner zone through which the process gas flows.

In further preferred embodiments, the heat transfer structures can have various forms and compositions. At least one heat transfer structure can have a surface heated by absorbed radiation and exposed to the flowing process gases so as to transfer at least a portion of the absorbed radiation to the process gases; at least one heat transfer structure can have a heated surface that is substantially planar; at least one heat transfer structure can have a heated surface that is arched; and at least one heat transfer structure can be substantially transparent to a selected band of radiation and be position before, or among, or after the plurality of absorbent surfaces.

Another preferred embodiment of the present invention provides a method for carrying out a CVD reaction between two or more process gases at a substrate within the interior of a CVD reactor chamber. Steps of the provided method can include flowing process gases through the CVD reactor chamber towards the substrate. One or more heat transfer structures concurrently receive heat from one or more heat sources associated with the reactor chamber. At least one of the heat transfer structures is positioned upstream of the substrate along the direction of process gas flow and spaced apart from the substrate in a direction transverse to process gas flow. Thereby, the received heat is then delivered to one or more process gases flowing within the chamber so as to thermalize at least one of the process gases prior to reaching the substrate.

Heat can be delivered to the flowing process gases so that the temperature of at least one process gas increases along the flow direction through the inner zone. Preferably, heat is delivered so that at least one process gas is thermalized to temperatures sufficient to prepare for the intended CVD reaction. In particular, where the intended CVD reaction involves HVPE deposition of a III-V compound, the sufficient temperature is at least approximately 900° C.

The flowing process gases can receive heat at various locations within the CVD chamber. Heat can be received and then delivered to the process gas flow at two or more heat transfer structures that at least partially overlap along the direction of process gas flow but are spaced apart and/or angled from each other in a direction transverse to process gas flow. Such heat transfer structures preferably and at least partially define heated walls of an inner zone within the reactor chamber through which the process gas flows. Heat can also be received and then delivered to the process gas flow at an additional heated component (other than a heat transfer structure), the additional heated component being arranged within the chamber so as to cooperate with at least one heat transfer structure in at least partially defining heated walls of an inner zone through which the process gas flows.

Thus, the heat transfer structures of this invention provide improved process gas thermalization leading to improved efficiency of the intended growth reaction, reduced efficiency of unintended reactions, reduced adduct formation, reduced incorporation of unwanted complexes or species into the growing epilayer, and the like. Further, these structures at least partially limit unwanted deposition on the outer reactor at lower temperatures (cold walls) by preventing thermalized precursor gases from contacting these walls. Reactor cleanliness and lifetime are thereby improved.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAIL DESCRIPTION OF THE PREFERRED EMBODIMENTS

Figure 1A:
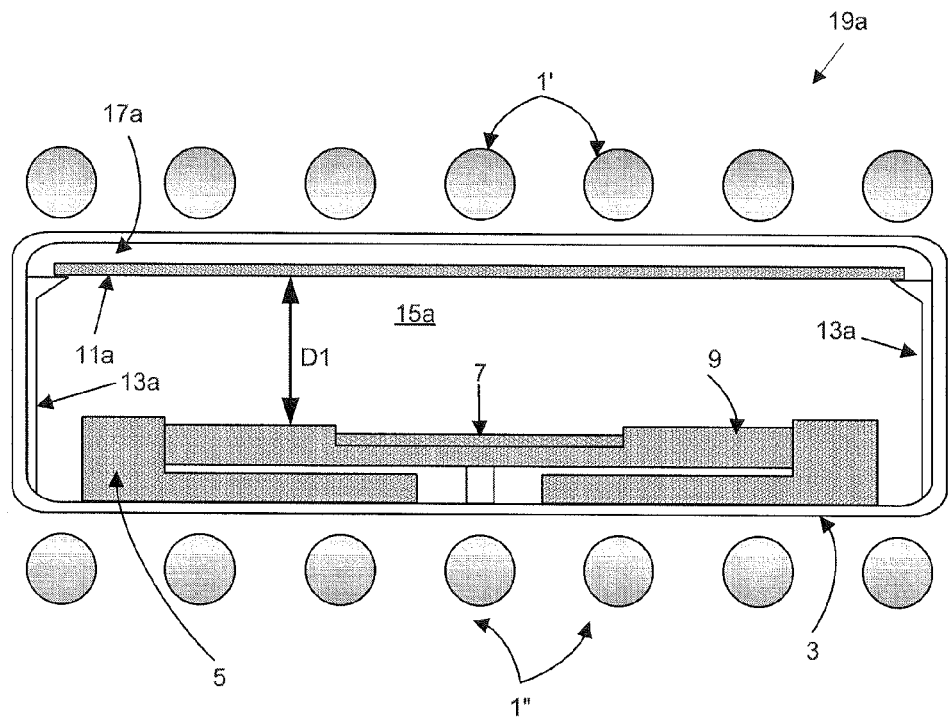
FIGS. 1A-D illustrate transverse cross-section views of several preferred embodiments of this invention.

In the following, the invention is described largely in terms of preferred embodiments useful in cold-wall CVD reactors heated with radiant heating elements, e.g., IR heating lamps, and having walls substantially transparent to radiated energy, e.g., comprising quartz. It should be understood that these preferred embodiments are not limiting, and as described above, this invention is useful on other types of CVD reactors with other types of heat sources. Provided first is a general description of such embodiments, which is followed by descriptions of exemplary embodiments illustrating particular features of the invention.

The term "substantially" as used throughout this application is to be understood as referring to relevant standard manufacturing tolerances and to other relevant commercially-reasonable standards. For example, a "substantially" planar surface of $B_4C$ is a surface that is planar within standard manufacturing tolerances, the tolerances being adequate to insure such a surface will fit and function for its described purposes in this invention. Commercially unreasonable precision (or lack thereof) is not intended.

Generally, preferred embodiments of the invention comprise heat transfer structures including one or more radiation-absorbing ceramic plates arranged in a reactor chamber in a manner so as to aid in the thermalization of precursor gases, that is, to promote transfer of heat from absorbed radiation to the process gases flowing within the reactor prior to their reaching a substrate within the chamber. In most embodiments, therefore, at least part of one heat transfer structure is arranged to contact and transfer heat to process gases prior to their reaction at a substrate. In other words, at least one heat transfer structure is arranged partially or wholly upstream of the substrate. Generally, the plates have relatively great horizontal extension but relatively thin vertical extension, and in various embodiments, can be planar, arched, domed, or the like. In view of their radiation absorbing characteristics, such heat transfer structures and plates are referred to herein as "black body plates" (BBP).

Advantageously, a plurality of modular and planar heat transfer structures are provided, and the modular structures are arranged within the chamber so as to define a single, elongated plane comprised of such structures. Preferably, the heat transfer structures are freely individually removable from and replaceable within the CVD reactor chamber so that different configurations and arrangements of the heat transfer structures can be assembled in the reactor chamber.

In preferred embodiments, the BBPs are arranged, in cooperation with internal components already present in the reactor (e.g., susceptor, susceptor rings, and the like, collectively referred to as "other internal components" or as "conventional components"), so as to partially or fully define and enclose an elongated zone inside the reactor through which process gases flow prior to reaching the susceptor. Further, one or more of the BBPs, and generally also one or more of other internal components, are heated by the heating elements so that one or more of the defining boundaries or walls of the inner zone are heated. Accordingly, since at least one, and preferably two or more, walls of the inner zone are heated, the temperatures of the gases flowing in the inner zone will increase toward the temperatures of the heated walls. The inner zone is also referred to herein as an isothermal hot zone (IHZ), although this term is not to be taken literally.

The combination of the heated inner zone, the IHZ, within a cold wall reactor can be considered as a hybrid cold wall (HCW) reactor. A HCW reactor has at least two heating zones defined in separate portions of a transverse section of the reactor and extending longitudinally along part or all of the reactor. Generally, a cooler exterior or outer zone will partially or fully surround a hotter interior or inner zone Optionally, additional heating zones can be arranged in a conventional manner longitudinally along the reactor length by, e.g., differently heating different longitudinal portions of the inner zone and optionally also of the outer zone. For example, heat-lamp intensity can controlled differently with a first longitudinally portion of the inner zone being less intensely heated and a following longitudinally portion being more intensely heated.

In preferred embodiments, the BBPs are sized and shaped in a modular fashion so that differently configured inner zones can be reversibly assembled from time-to-time within a single reactor chamber from different types of BBP modules arranged in different arrangements. Particular BBP modules and arrangements, and generally the configuration of the inner zone, are preferably selected according to the requirements of a particular CVD process to be performed. For example, modular BBPs can include BBPs of similar widths but varying lengths so that an inner zone can be assembled that extends only through the first third of a reactor, or extends only through the first two thirds of a reactor, or extends through the entire a reactor, or extends only through the last third of a reactor, or extends through the first and last thirds of a reactor, or the like.

Such modular and configurable embodiments also preferably include fixtures and similar means for supporting plates. For example, such fixtures can be separate components such as legs, or shelves, or the like, on which BBPs rest; alternatively, the inner wall of the reactor chamber can be configured with fixtures such as ledges, pillars, and the like; alternatively the plates can be configured to be interlocking, self-supporting, include support legs, and so forth. Further, in embodiments including laterally-positioned BBPs that define lateral boundaries along part or all of an inner zone, additional fixtures can be provided to maintain such BBPs in position. Alternatively, such BBPs can be self-supporting.

To promote non-turbulent gas flows in the inner zone, it is advantageous for the boundaries defining the inner zone not to be interrupted by gaps, irregularities, or roughness. Accordingly, in embodiments where it is preferable for the inner zone to be heated in a discontinuous or segmental fashion, any necessary gaps between BBPs are preferably spanned and filled-in by non-absorbent (this is transparent) structures, e.g., plates, configured in cooperation with the BBPs to form a continuous inner zone boundary. Transparent plates can be advantageous in that they allow one or more portions of the interior of the inner zone, e.g., where the substrate resides, to be directly heated by the heat sources. For example, a transparent top plate above the susceptor can allow the susceptor to be directly heated; also a transparent plate can provide a window through which an ongoing CVD process can be monitored.

In preferred embodiments, the BBPs comprise materials, e.g., ceramic materials, which are capable of withstanding the harsh internal environment of an operating CVD reactor. Known suitable and light-absorbent ceramic materials that can be used in BBPs include, e.g., graphite, pyrolytic graphite, silicon carbide (SiC), aluminum nitride (AlN), boron nitride (BN), pyrolytic boron nitride (PBN), tantalum carbide (TaC) and boron carbide ($B_4C$). Graphite is a less preferred material because it is usually brittle and thus a potential source of reactor and epilayer contamination. On the other hand, both SiC and AlN are preferred materials for black body ceramic plates for many CVD processes, since both are able to withstand the temperatures and harsh chemical environments of an operating CVD system. However, the environment created by certain CVD processes can degrade even SiC and AlN, and these materials are less preferred for such processes.

In particular, HVPE growth of GaN can generate conditions which can degrade even SiC and AlN over extended periods of time. For such processes (which are preferred for HVM (high volume manufacture) of GaN), BN, PBN, or $B_4C$ are materials preferred for BBPs in place of SiC and AlN. Of these boron-containing materials, BN and PBN are less preferred in this application because they are unstable in an oxidizing environment above 850° C. $B_4C$ is preferred because it is capable of withstanding the temperature (melting point of 2450° C.) and chemical environment of an operating HVPE reactor over extended periods of time. Additionally, carefully positioned and heated $B_4C$ plates can also be used to protect quartz areas in the chamber from material deposition and condensation.

In addition to the above thermal and chemical characteristics, materials used for BBPs should be absorbent, like black bodies, so that they can be heated efficiently by radiant heating elements. A key black-body characteristic of a material is its emissivity ($\epsilon$) in the spectral range emitted by the heating lamps. Emissivity is defined as the ratio of the emissive power of a material surface compared to the emissive power of an ideal black body at the same temperature, and is generally measured indirectly by measuring reflectivity since $\epsilon$ is approximately (1−reflectivity). For example, a mirrored surface may reflect 98% of the energy, while absorbing and emitting 2%, whilst, a good blackbody surface will reverse the ratio, absorbing and emitting 98% of the energy and reflecting only 2%.

Various emissivity data are available for the materials of interest, i.e., AlN, SiC and $B_4C$. U.S. Pat. No. 6,140,624 reports an emissivity for SiC of 0.92 at a wavelength 1.55 μm; Fuentes et al. (Fusion Engineering and Design 56-57 3 15 (2001)) report an emissivity for $B_4C$ of 0.92 (measurement wavelength not given); Barral et al. (IEPC-2005-152 "Hall Effect Thruster with an AlN discharge channel") reports an emissivity of 0.98 for AlN. According to the reported emissivity for AlN, SiC and $B_4C$ (0.98, 0.92, 0.92, respectively) data along with their thermal and chemical characteristics, these material are suitably absorbent for use in BBPs.

Figure 1B:
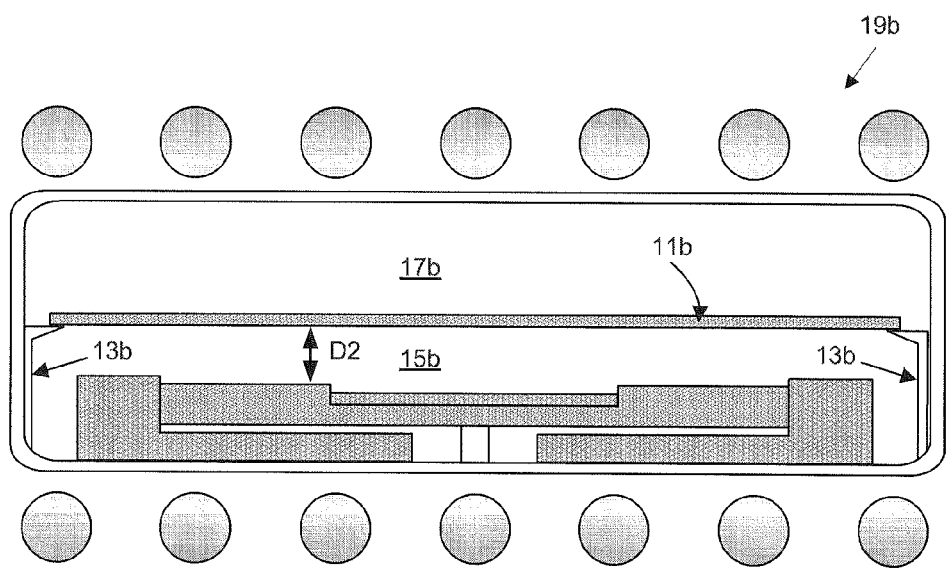
Figure 1C:
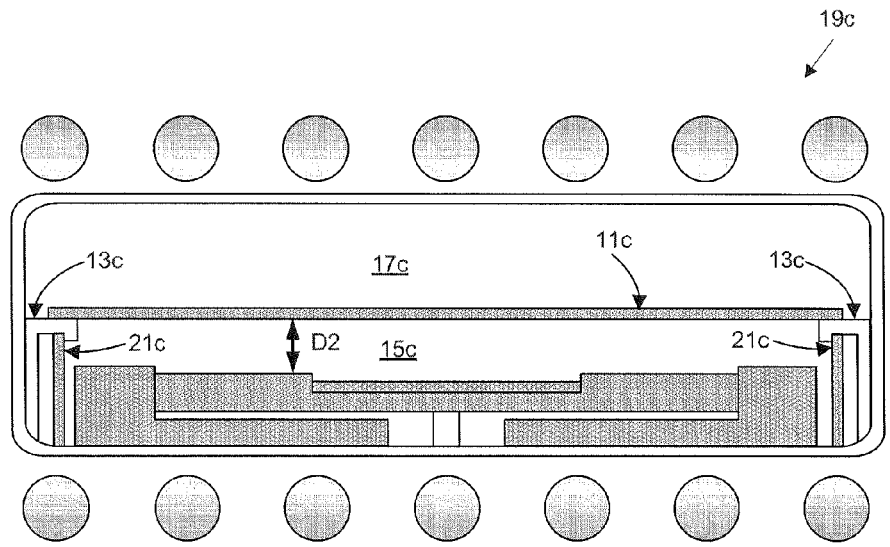
Figure 1D:
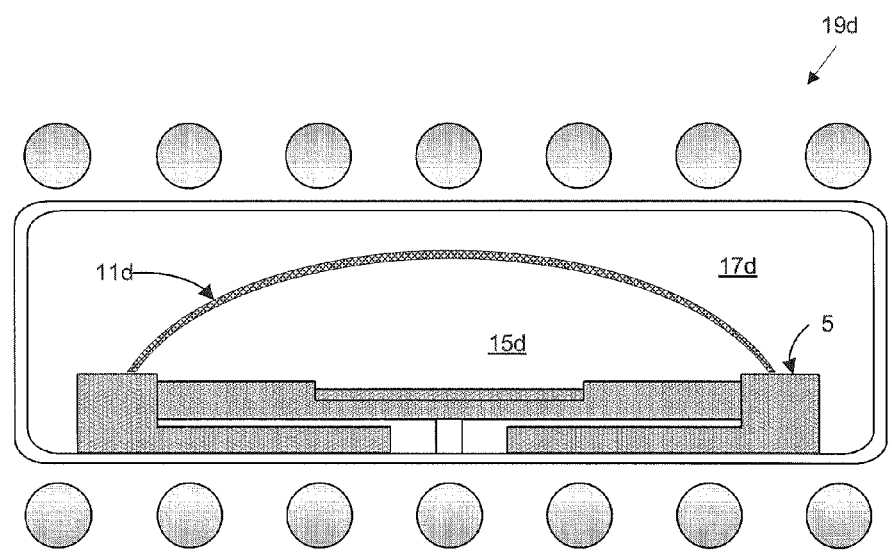
Figure 2A:
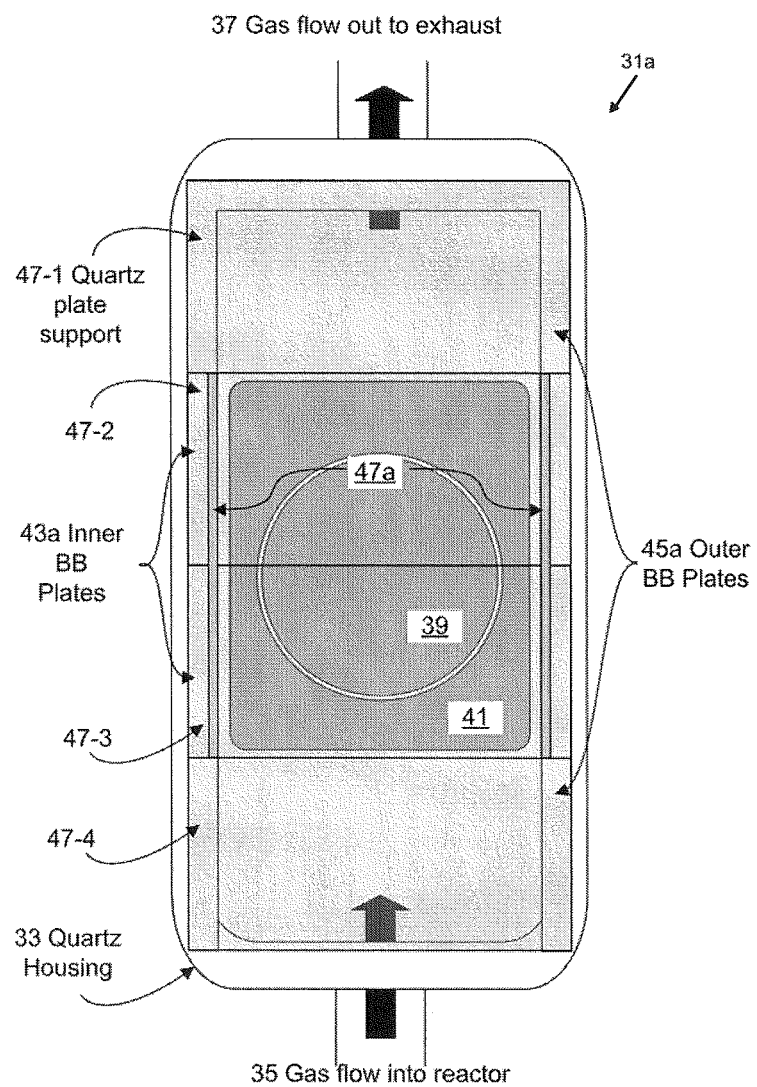
FIGS. 2A-C illustrate top plan views of several preferred embodiments of this invention.
Figure 2B:
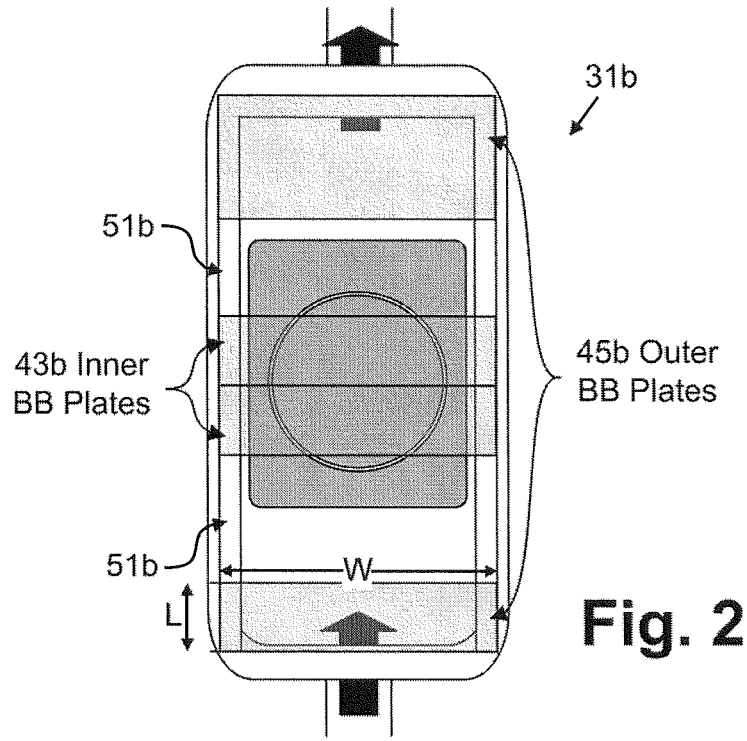
Figure 2C:
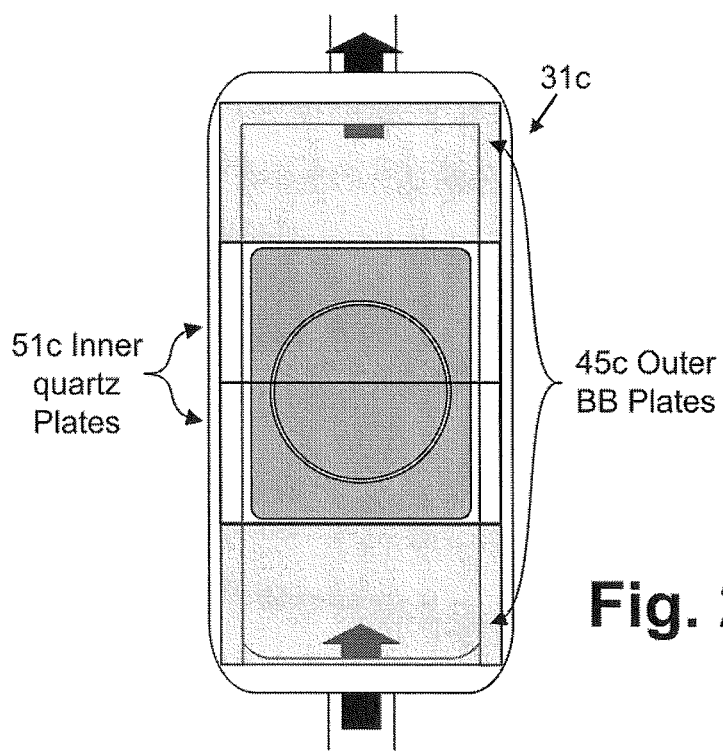

Turning now to exemplary preferred embodiments, FIGS. 1A-D illustrate transverse cross-sections of alternative preferred embodiments; and FIGS. 2A-C illustrate top plan views of alternative preferred embodiments. Preliminary, in FIGS. 1A-D, reference numerals for elements in FIGS. 1B-D that differ from corresponding elements in FIG. 1A are provided with suffixes "b", "c", and "d", respectively. Reference numerals for elements in FIGS. 1B-D that are substantially the same as corresponding elements in FIG. 1A are not provided. Similarly, in FIGS. 2A-C, reference numerals for elements in FIGS. 2B-C that differ from corresponding elements in FIG. 2A are provided with suffixes "b" and "c", respectively. Reference numerals for elements in FIGS. 2B-C that are substantially the same as corresponding elements in FIG. 2A are not provided.

FIGS. 1A-D illustrate the invention arranged in conventional CVD reactor chamber 19(a, b, c, d). This chamber is defined by housing 3 of quartz (or of other material transparent to radiation from the radiant heat sources). It is heated by upper radiant heating elements, e.g., heat lamps, 1' positioned above the chamber, and by lower radiant heating elements, e.g., heat lamps, 1" positioned below the chamber. Conventional components internal to this chamber include susceptor 9 with central substrate holder 7 (illustrated with a substrate), and susceptor control ring 5. This invention adds to the conventional components in the interior of chamber 19(a, b, c, d), one or more BBPs 11(a, b, c, d) and, if necessary, one or more fixtures 13(a, b, c). Both the BBPs and the fixtures preferably comprise the materials described above; the fixtures can also comprise quartz.

FIG. 1A illustrates an exemplary embodiment of this invention having one or more BBPs 11a supported on fixtures 13a. Inner zone 15a is here defined by an upper boundary including BBPs 11a and a lower boundary including the internal reactor components 5, 7, and 9 (and possibly other components not illustrated). Vertical extent D1 of the inner zone is defined by these boundaries. In CVD systems provided with automatic or robotic means for substrate transfer in and out of a reactor chamber, extent D1 is preferably sufficiently great so that such transfer means can operate without hindrance. Longitudinally, at least part of BBP 11a is positioned upstream of the substrate holder. The upper boundary is heated by upper heat sources 1' and the lower boundary by lower heat sources 1". Inner zone 15a is not provided with additional lateral BBPs, and is therefore bounded laterally by the quartz reactor housing. The housing is generally only minimally heated, if heated at all, by heat sources 1' or 1". An outer zone is generally defined by those portions of the reactor interior that are outside of the inner zone. Here, outer zone 17a is outside of inner zone 15a, and has a lower boundary defined by BBP 11a with the remaining boundaries defined by quartz housing 3. Both lateral edges of BBP 11a are supported in the reactor by left and right fixtures 13a, which can be made of quartz. A single fixture can extend along a significant portion of the longitudinal dimension of chamber 3, or alternatively multiple fixtures can be spaced longitudinally in the chamber. Alternatively, the plate support fixtures can be integral with quartz housing 1.

Preferably, the components added by this invention, BBP 11a (also, b, c, and d) and (optionally) plate support fixtures 13a (and also b and c) are modular and separate from the housing and other internal components and can be removed and/or replaced in the reactor chamber. This allows differently configured inner zones to be assembled in the single reactor chamber 19a.

Preferably, the majority of the process gases are introduced into chamber 19a so as to flow through inner zone 15a prior to reacting and reacting at a substrate supported on holder 7. As the gases flow through inner zone 15a, they will gradually become thermalized, that is, their temperatures will increase, towards the temperatures of the heated upper and lower boundaries. Since the inner zone extends partially or wholly upstream of the substrate holder, the gases will be prepared to react at the substrate, which is here heated from below by conduction from support 7. Heated inner zone 15a will generally be at a higher temperature than outer zone 17a and is also referred to herein as an isothermal hot zone (IHZ). The inner and outer zones therefore create a two heating zones within the chamber, the zone being vertically layered and extending longitudinally.

FIG. 1B illustrates an embodiment similar to that of FIG. 1A except that fixtures 13b are shorter than fixtures 13a so that the vertical extent of inner zone 15b, extent D2, is less than the vertical extent of inner zone 15a, extent D1. Extent D2 is preferably not so small that it will interfere or hinder automatic or robotic means for substrate transfer that may be present. In preferred modular embodiments, the components, 11b and 13b, added to the interior of chamber 19(a, b) can be removed and replaced, so that the embodiments FIG. 1A and FIG. 1B can be converted into each other by interchanging fixtures 13a and 13b.

FIG. 1C illustrates an embodiment similar to that of FIG. 1B except that inner zone 15c of this latter embodiment is provided with laterally positioned BBPs 21c that act as left and right side walls of the inner zone. BBPs 21c can be heated to some degree by heat sources 1' and 1", and more directly heated if additional heat sources are positioned adjacent to the left and right later walls of chamber 19b. At last portions of BBPs 21c are preferably positioned upstream of the susceptor holder. These BBPs can extend along part of all of inner zone 15c, but if they only extend along part of the inner zone, it is preferable that gaps be filled with structures that limit turbulence of gases flowing in the inner zone, e.g., partially transparent size walls. Fixtures 13c illustrated here both support BBP 11c and retain BBPs 21c in a vertical orientation away from and out of contact with the wall of chamber 3. Alternatively, side walls can be held in contact with the chamber walls; alternatively, separate fixtures can be provided to retain BBPs 21c.

FIG. 1D illustrates use of a BBP having a non-planar configuration (in contrast to the planar BBPs of FIGS. 1A-C). BBP 11d has a transverse arch which extends longitudinally within chamber 19d beginning upstream of the susceptor holder and extending along the gas flow. BBP 11d is illustrated as having an arch sufficient to permit its lateral edges to be supported directly on components internal to chamber 3, e.g., susceptor control ring 5 and the like; alternatively, fixtures can be provided to retain BBP 11d in position. Alternatively, fixtures can also be provided to elevate the lateral edges of BBP 11d above the other internal components of the reactor (in such embodiments BBP 11d can be less arched or even largely planar). BBP 11d is heated by upper heat sources with the heating more intense centrally. Inner zone 15d is defined both above and laterally by BBP 11d, and therefore both its upper and lateral boundaries are heated. This inner zone is defined below by other components internal to reactor 19d, which are also preferably heated by lower heat sources. Thus, this inner zone assumes the form of a transversely arched and longitudinally extended passageway beginning upstream of the susceptor holder and heated on all sides. Outer zone 17d now can entirely surrounds the inner zone bounding it away from the housing of the reactor chamber.

As is generally preferable, the majority of the process gases are introduced into chamber 19d so as to flow through inner zone 15d prior to reaching and reacting at a substrate supported on the substrate holder. Since this inner zone can be heated on all sides, gases flowing within can become more completely thermalized than in the previously embodiments. Again, since heated inner zone 15d is entirely surrounded by outer zone 17d, this embodiment can be considered as having two longitudinally-extending heated zones, a hotter zone which is enclosed by a cooler zone, which is in turn enclosed by the reactor chamber walls.

FIGS. 2A-C illustrate top plan views illustrating exemplary arrangements of BBPs and transparent plates along the longitudinal axis of a convention CVD reactor chamber 31(a, b, c) with quartz housing 33. Such BBPs are also referred to herein as BBP segments or simply as segments. The illustrated chamber has convention internal components including susceptor 39 and susceptor control ring 41. Process gas flows along the longitudinal axis of this chamber from inlet ports 35, across susceptor 39, and out through exhaust port 37. To these conventional components, this invention adds BBPs 43(a), 45(a, b, c), transparent plates 51(b, c), and fixtures such as fixtures 47-(1, 2, 3, 4). The cross sections of reactors in these figures can be as illustrated in FIGS. 1A-D. In particular BBPs and transparent plates can be planar or arched (or other shape).

FIG. 2A illustrates one exemplary arrangement in which the inner and outer BBPs extend throughout chamber 31a from inlet ports 35 to exhaust port 37. Lateral BBPs are provided at 47a extending along the lengths of the susceptor and susceptor control ring. The horizontally and vertically oriented BBPs are supported and maintained in position by fixtures 47-1, 47-2, 47-3, and 47-4. Fixtures 47-1 and 47-2, which only support horizontally-oriented outer BBPs 45a can be similar to, e.g., fixtures 13a or 13b of FIGS. 1A-B. Fixtures 47-3 and 47-4 which support horizontally-oriented inner BBPs 43a and also retain vertically-oriented BBPs 47a can be similar to, e.g., fixtures 13c of FIG. 1C. The inner and outer BBPs can be largely planar as in FIGS. 1A-C or largely arched as in FIG. 1D (or other shape). Preferably at least both the inner and outer BBPs and the other internal components are heated.

Preferably, the majority of process gas flows through an inner zone defined between the BBPs 43a and 45a and the other internal components susceptor 39 and susceptor control ring 41. Accordingly, process gas reaching a substrate on the susceptor will be thermalized by heat transferred from those of BBPs 43a and 45a that are adjacent to the inlet ports (upstream of the substrate). Heat can also be transferred from the portions of susceptor control ring 41 contacted by the flowing gases prior to flowing over the substrate. Those of BBPs 43a and 45a that are adjacent to the exhaust port (downstream of the substrate) along with portions of susceptor control ring 41 contacted by the flowing gases after flowing over the substrate can transfer heat to the spent process gases in order to prevent unwanted deposition or condensation on the reactor housing and internal components.

FIGS. 2B-C illustrate alternative arrangements of BBP segments in combination with substantially transparent segments but without side walls. There arrangements provide different distributions of heating of the upper and lower surface of the inner zone which can be advantageous for certain processes. Preferably, all segments fit together to present a smooth surface to gas flowing within the inner zone. Transparent segments are advantageous, first, to provide a selected longitudinal distribution of heating of the inner zone and thus also of thermalization of gases flowing within the inner zone. Transparent segments are also advantageous to provide windows through which an ongoing CVD can be observed and monitored. For that latter use, transparent segments should be substantially transparent to the radiation used for such observation and monitoring but can be more or less absorbent to the radiation from the radiant heating elements (if spectrally distinct from radiation used for observing). Transparent segment can be made out of commonly available materials such as quartz or sapphire.

FIG. 2B illustrates an exemplary embodiment with outer BBP segments 45b comprising a segment at the front of chamber 31b and a segment at the rear of the chamber and with a pair of inner BBP segments 43b arranged centrally in the chamber covering the greater portion of the susceptor. (Here, the rear outer BBP segment has a greater length than the lengths the front outer (L) and the two inner BBP segments. All segments have similar widths (W)). A pair of transparent segments 51b comprising, e.g., quartz, are arranged between inner 43b and outer 45b BBP segments. Although the upper wall of the inner zone is not substantially heated at locations of the transparent plates, such plates allow the upper heat sources to directly heat components interior to chamber 31b under the transparent plates. Therefore, these components, being directly heated by both the upper and lower heat sources, can be at a higher temperature than otherwise.

FIG. 2C illustrates another exemplary embodiment with a pair of outer BBP segments 45c between which are a pair of inner, substantially transparent segments 51c (plates, arches, and the like). Here, inner zone horizontal walls are heated upstream of the susceptor in order to thermalize process gas and downstream of the susceptor to limit unwanted deposition. The central transparent segments allow the susceptor and support ring (and other internal components) to be directly heated on both sides, possibly to a higher temperature than otherwise. These transparent segment also provide well positioned windows for observing the substrate during an ongoing CVD process. This arrangement can be advantageous for processes that require high substrate temperatures in combination with thermalized process gases.

It should be noted multiple variations on the position and height of the BBP are possible within this invention, within the mentioned constraints of other fixtures within the reactor and any delivery systems that may require access to the reactor, i.e. robotic arms etc. The thickness of the BBP can be adjusted to finer dimensions if more critical thermal control is required. Also transverse dimensions can be finer if the BBPs width must be equal to W, to enable support on the fixtures plates and preventing the plates from falling into the reactor.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for thermalizing a process gas when carrying out a chemical vapor deposition (CVD) reaction between two or more process gases at a substrate within the interior of a CVD reactor chamber which comprises: flowing process gases through the CVD reactor chamber towards the substrate; receiving heat from one or more heat sources associated with the reactor chamber at one or more heat transfer structures, at least one of which is positioned upstream of the substrate along the direction of process gas flow and spaced apart from the substrate in a direction transverse to process gas flow; and delivering at least part of the received heat to one or more process gases flowing within the chamber so as to thermalize at least one of the process gases prior to reaching the substrate to a temperature sufficient to prepare for an intended CVD comprising hydride vapor phase epitaxy (HVPE) deposition of a III-V compound upon the substrate while limiting unwanted reactions that generate unreactive complexes or species.

2. The method of claim 1, wherein heat is delivered to the process gas flow at two or more heat transfer structures positioned upstream of the substrate along the direction of process gas flow that at least partially overlap along the direction of process gas flow but are spaced apart and/or angled from each other in a direction transverse to process gas flow, so as to at least partially define heated walls of an inner zone through which the process gas flows.

3. The method of claim 2, wherein the heat is delivered so that the temperature of at least one process gas increases along the flow direction through the inner zone.

4. The method of claim 1, which further comprises controlling the delivered heat so that at least one process gas is thermalized to temperatures sufficient to prepare for the intended CVD reaction, wherein the intended CVD reaction comprises hydride vapor phase epitaxy (HVPE) deposition of a III-V compound, and wherein the sufficient temperature is at least 900° C.

5. The method of claim 1, which further comprises providing a plurality of modular and planar heat transfer structures and arranging the modular structures within the chamber so as to define a single, elongated plane comprised of such structures, wherein the heat transfer structures are freely individually removable from and replaceable within the CVD reactor chamber so that different configurations and arrangements of the heat transfer structures can be assembled in the reactor chamber.

6. The method of claim 5, which further comprises arranging the single elongated plane of such structures to be parallel to the flow of the process gases.

7. The method of claim 1, wherein the heat transfer structures comprise a plurality of substantially planar heat-transfer plates and the method further comprises transferring heat to the heat-transfer plates by conduction from resistive heat sources.

8. The method of claim 1, wherein the heat transfer structures comprise a plurality of substantially planar heat-transfer plates and the method further comprises transferring heat to the heat-transfer plates by absorption from radiant heat sources.

9. The method of claim 1, which further comprises providing the at least one heat transfer structure of a material that is both radiation absorbent and also resistant to the thermal and chemical conditions arising within the CVD reactor chamber during selected CVD processes including the hydride vapor phase epitaxy (HVPE) deposition of a III-V compound.

10. The method of claim 9, wherein the material comprises one or more of boron nitride (BN), pyrolytic boron nitride (PBN) and boron carbide ($B_4C$).

11. The method of claim 1, which further comprises arranging components additional to the thermalization apparatus within the reactor chamber, the additional components comprising at least one of a susceptor and a susceptor support ring, with the susceptor supporting the substrate and above which the process gases react.

12. The method of claim 11, wherein at least one heat transfer structure is positioned, with respect to process gas flow through the reactor chamber, to deliver heat to the process gas flow at locations downstream of the substrate along the process gas flow.

13. The method of claim 11 which further comprises heating at least one additional component within the chamber, wherein the heated additional component cooperates with at least one heat transfer structure so as to at least partially define heated walls of an inner zone through which the process gas flows.

14. The method of claim 1, which further comprises arranging two or more heat transfer structures with respect to process gas flow through the reactor chamber to deliver heat to the process gas flow at locations that at least partially overlap along the process gas flow but with the transfer structures spaced apart and/or angled from each other transverse to process gas flow so as to at least partially define heated walls of an inner zone through which the process gas flows.

15. The method of claim 1, which further comprises providing at least one heat transfer structure that includes a surface to be heated by absorbed radiation and exposed to the flowing process gases so as to transfer at least a portion of the absorbed radiation to the process gases.

16. The method of claim 15, which further comprises providing at least one heat-transfer structure that is substantially transparent to a selected band of radiation, with the transparent structure being positioned before, or among, or after the plurality of heated surfaces.

17. A method for thermalizing a process gas when carrying out a chemical vapor deposition (CVD) reaction between two or more process gases at a substrate within the interior of a CVD reactor chamber which comprises: flowing process gases through the CVD reactor chamber towards the substrate; providing a plurality of modular and planar heat transfer structures; arranging the modular structures within the chamber so as to define a single, elongated plane comprised of such structures, wherein the heat transfer structures are freely individually removable from and replaceable within the CVD reactor chamber so that different configurations and arrangements of the heat transfer structures can be assembled in the reactor chamber; heating one or more heat transfer structures from one or more heat sources associated with the reactor chamber; positioning at least one two or more heat transfer structures upstream of the substrate along the direction of process gas flow, while spacing the structure from the substrate in a direction transverse to process gas flow; and transferring heat from the heat transfer structures to one or more of the process gases flowing within the chamber and past the heat transfer structures so as to thermalize at least one of the process gases prior to reaching the substrate to a temperature sufficient to prepare for an intended CVD comprising hydride vapor phase epitaxy (HVPE) deposition of a III-V compound upon the substrate while limiting unwanted reactions that generate unreactive complexes or species.

18. A method for thermalizing a process gas when carrying out a chemical vapor deposition (CVD) reaction between two or more process gases at a substrate within the interior of a CVD reactor chamber which comprises: flowing process gases through the CVD reactor chamber towards the substrate; heating the reactor chamber utilizing first heating elements; heating one or more heat transfer structures from one or more additional heat sources; positioning at least one heat transfer structure upstream of the substrate along the direction of process gas flow, while spacing the structure from the substrate in a direction transverse to process gas flow; arranging additional heat transfer structures with respect to process gas flow through the reactor chamber to deliver heat to the process gas flow at locations that at least partially overlap along the process gas flow but with the transfer structures spaced apart and/or angled from each other transverse to process gas flow so as to at least partially define heated walls of an inner zone through which the process gas flows; providing at least one heat-transfer structure that is substantially transparent to a selected band of radiation, with the transparent structure being positioned before, or among, or after the plurality of heated surfaces; and transferring heat from the heat transfer structures to the process gas flowing through the inner zone of the chamber past the heat transfer structure so as to thermalize at least one of the process gases prior to reaching the substrate to a temperature sufficient to prepare for an intended CVD comprising hydride vapor phase epitaxy (HVPE) deposition of a III-V compound upon the substrate while limiting unwanted reactions that generate unreactive complexes or species.

\* \* \* \* \*

UNITED STATES PATENT AND TRADEMARK OFFICE
CERTIFICATE OF CORRECTION

| | | |
|---|---|---|
| PATENT NO. | : 8,741,385 B2 | Page 1 of 1 |
| APPLICATION NO. | : 13/751558 | |
| DATED | : June 3, 2014 | |
| INVENTOR(S) | : Arena et al. | |

It is certified that error appears in the above-identified patent and that said Letters Patent is hereby corrected as shown below:

In the Claims:

<u>Column 16:</u>
Line 53 (claim 17, line 15), after "at least", delete "one".

Signed and Sealed this
Twenty-ninth Day of July, 2014

Michelle K. Lee
*Deputy Director of the United States Patent and Trademark Office*